United States Patent
Lim et al.

(10) Patent No.: US 7,419,862 B2
(45) Date of Patent: Sep. 2, 2008

(54) METHOD OF FABRICATING PSEUDOMORPHIC HIGH ELECTRON MOBILITY TRANSISTOR

(75) Inventors: Jong Won Lim, Daejeon (KR); Ho Kyun Ahn, Daejeon (KR); Hong Gu Ji, Daejeon (KR); Woo Jin Chang, Daejeon (KR); Jae Kyoung Mun, Daejeon (KR); Hea Cheon Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 158 days.

(21) Appl. No.: 11/446,750

(22) Filed: Jun. 5, 2006

(65) Prior Publication Data

US 2007/0134862 A1    Jun. 14, 2007

(30) Foreign Application Priority Data

Sep. 12, 2005    (KR) ...................... 10-2005-0084755

(51) Int. Cl.
*H01L 21/336* (2006.01)
*H01L 21/8234* (2006.01)
(52) U.S. Cl. ........................ 438/197; 438/571; 438/572; 257/155; 257/192
(58) Field of Classification Search .................. 438/197, 438/571, 572, 573, 574, 576; 257/155, 192, 257/194, 195
See application file for complete search history.

(56) References Cited

U.S. PATENT DOCUMENTS 5,021,361 A * 6/1991 Kinoshita et al. ............. 438/23

(Continued)

FOREIGN PATENT DOCUMENTS

JP    07-335669    12/1995

(Continued)

OTHER PUBLICATIONS

'A Comparative Study on the DC, Microwave Characteristics of 0.12 μm Double-Recessed Gate AlGaAs/InGaAs/GaAs PHEMTs Using a Dielectric Assisted Process' Lim et al., Extended Abstracts of the 2005 International Conference on Solid State Devices and Materials, Kobe, 2005, pp. 690-691, pp. 690-691.

(Continued)

*Primary Examiner*—Phuc T Dang
(74) *Attorney, Agent, or Firm*—Ladas & Parry LLP (57) ABSTRACT

Provided is a method of fabricating a pseudomorphic high electron mobility transistor (PHEMT). The method includes the steps of: preparing a substrate including a channel layer and a capping layer that is the uppermost layer; forming a source and a drain on the capping layer; forming a first protective layer on the entire surface of the resultant structure and then patterning the first protective layer to expose a portion of the capping layer in a channel region; removing the exposed portion of the capping layer to form a first recess structure; forming a second protective layer on the entire surface of the resultant structure and then patterning the second protective layer to expose a portion of the substrate in the first recess structure so that a second recess structure is formed; forming a multilayered photoresist layer on the entire surface of the resultant structure and then patterning the multilayered photoresist layer to expose a portion of the substrate through the second recess structure and form a gate-shaped opening; and depositing a metal layer to fill the gate-shaped opening and then removing the multilayered photoresist layer to form a gate connected to the substrate through the second recess structure.

9 Claims, 8 Drawing Sheets

U.S. PATENT DOCUMENTS

| | | |
|---|---|---|
| 5,698,870 A | 12/1997 | Nakano et al. |
| 5,789,767 A | 8/1998 | Omura |
| 6,242,293 B1 | 6/2001 | Danzilio |
| 6,248,666 B1 * | 6/2001 | Frijlink et al. ............... 438/689 |
| 6,387,783 B1 * | 5/2002 | Furukawa et al. ........... 438/574 |
| 6,573,129 B2 | 6/2003 | Hoke et al. |
| 6,838,325 B2 | 1/2005 | Whelan et al. |
| 6,876,011 B1 | 4/2005 | Hisaka |
| 6,943,068 B2 * | 9/2005 | Chang et al. ................ 438/167 |

FOREIGN PATENT DOCUMENTS

| | | |
|---|---|---|
| JP | 09-036133 | 2/1997 |
| JP | 10-135239 | 5/1998 |
| JP | 11-162945 | 6/1999 |
| JP | 2003-059949 | 2/2003 |
| JP | 2004-193273 | 7/2004 |
| KR | 10-20050051650 | 6/2005 |
| KR | 10-20050086944 | 8/2005 |

OTHER PUBLICATIONS

Japanese Office Action issued by the Japanese Patent Office, dated Jul. 2, 2008 to the Japanese counterpart patent application No. 2006-170476.

* cited by examiner

METHOD OF FABRICATING PSEUDOMORPHIC HIGH ELECTRON MOBILITY TRANSISTOR

CROSS-REFERENCE TO RELATED APPLICATION

This application claims priority to and the benefit of Korean Patent Application No. 2005-84755, filed Sep. 12, 2005, the disclosure of which is incorporated herein by reference in its entirety.

BACKGROUND

1. Field of the Invention

The present invention relates to a method of fabricating a heterojunction semiconductor device, and more specifically, to a method of fabricating a pseudomorphic high electron mobility transistor (PHEMT).

2. Discussion of Related Art

In general, a pseudomorphic high electron mobility transistor (PHEMT), which is a compound semiconductor device, includes material layers having quite different lattice constants so that a channel layer is structurally transformed due to this lattice mismatch. As a result, it is difficult to have layers grown on a substrate during the fabrication process of the PHEMT. Nevertheless, since the PHEMT has a high density of charges to transfer to the channel layer and high electron mobility, the PHEMT has better power and noise characteristics than conventional devices have. Accordingly, the PHEMT can operate in a high frequency range and has higher electron speed characteristics than devices using silicon have so that it can be widely used for micro- or millimeter-band devices. In particular, because the PHEMT has a good ultra-high-frequency noise characteristic, the PHEMT can accelerate the developments of high-performance millimeter-band wireless-communication circuits and components and optical-communication circuits and components exceeding several tens of Gbps.

A high-speed device should have a short gate length for high modulation and a wide gate sectional area enough to lower resistance for good noise characteristics. To meet these requirements, a T-shaped gate or a mushroom-shaped gate has lately been employed. Typically, the T-shaped gate or the mushroom-shaped gate may be formed by an electron beam (e-beam) lithography process or a photolithography process. However, the photolithography process has a specific resolution limit in forming a gate electrode having a fine linewidth. Accordingly, a gate electrode is usually formed through the e-beam lithography process.

Figure 1:
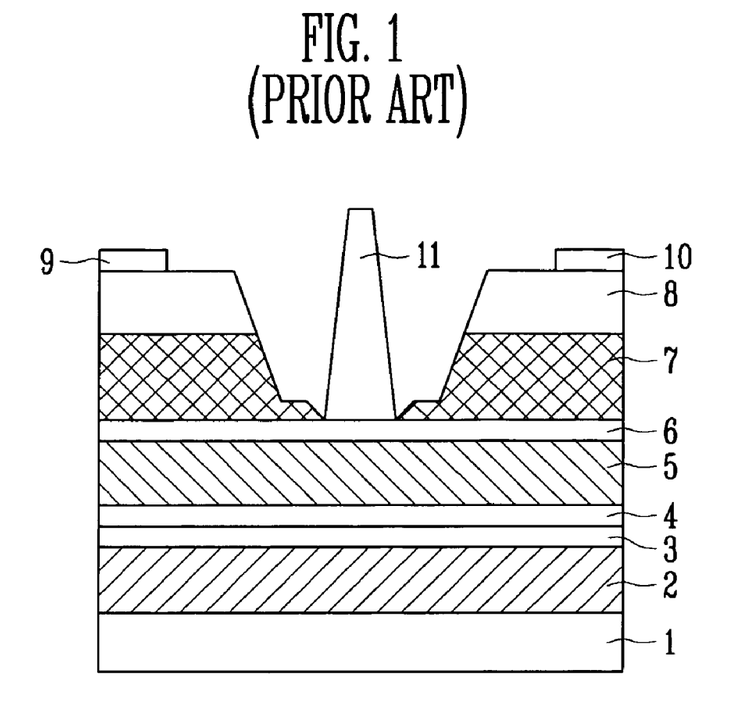
FIG. 1 is a cross-sectional view illustrating a method of fabricating a conventional pseudomorphic high electron mobility transistor.

FIG. 1 is a cross-sectional view illustrating a method of fabricating a conventional PHEMT, which schematically shows a PHEMT using a substrate of AlGaAs/InGaAs/GaAs according to U.S. Pat. No. 6,242,293 filed on Nov. 18, 1998.

A channel layer 2 including a dimensional electron gas (DEG) layer, an AlGaAs spacer layer 3, a Si delta-doping layer 4, an n-AlGaAs layer 5, an etch stop layer 6, an n-GaAs layer 7, and a GaAs capping layer 8 are formed on a semi-insulating GaAs substrate 1 including predetermined layers, and a source electrode 9 and a drain electrode 10 are formed on the GaAs capping layer 8.

A photoresist layer (not shown) is formed on the entire surface of the resultant structure and then patterned, thereby forming a photoresist pattern. Then, the GaAs capping layer 8 and the n-GaAs layer 7 are patterned by an etching process using the patterned photoresist as an etching mask to expose the etch stop layer 6 in a channel region, so that a double recess structure is formed.

Thereafter, a metal layer is deposited on the entire surface of the resultant structure to fill the double recess structure, and the metal layer is patterned by an etching process using a predetermined photoresist pattern as an etch mask. Thus, a gate electrode 11 is formed such that the gate electrode 11 is connected to the etch stop layer 6 through the double recess structure.

However, in the above-described method, since the double recess structure is formed by a wet etching process, it is difficult to accurately control the linewidth of the gate electrode 11 due to etching of the lateral surfaces of the GaAs capping layer 8 and the n-GaAs layer 7. Also, an active region is exposed and oxidized so that the electrical characteristics of the PHEMT are degraded. Furthermore, an undercut is formed during the etching of the substrate, and thus the length of the gate electrode 11 increases and a source resistance increases. These problems deteriorate the electrical characteristics of the PHEMT and preclude high integration of the PHEMT.

SUMMARY OF THE INVENTION

The present invention is directed to a method of fabricating a pseudomorphic high electron mobility transistor (PHEMT) that does not permit an active region to be exposed and has a high breakdown voltage.

Also, the present invention is directed to a method of fabricating a PHEMT, which minimizes the linewidth of a gate electrode, effectively reduces a source resistance and a gate resistance, and also reduces a capacitance between gate and source/drain.

One aspect of the present invention provides a method of fabricating a PHEMT. The method includes the steps of: preparing a substrate including a channel layer and a capping layer that is the uppermost layer; forming a source and a drain on the capping layer; forming a first protective layer on the entire surface of the resultant structure and then patterning the first protective layer to expose a portion of the capping layer in a channel region; removing the exposed portion of the capping layer to form a first recess structure; forming a second protective layer on the entire surface of the resultant structure and then patterning the second protective layer to expose a portion of the substrate in the first recess structure so that a second recess structure is formed; forming a multilayered photoresist layer on the entire surface of the resultant structure and then patterning the multilayered photoresist layer to expose a portion of the substrate through the second recess structure and form a gate-shaped opening; and depositing a metal layer to fill the gate-shaped opening and then removing the multilayered photoresist layer to form a gate connected to the substrate through the second recess structure.

The first and second protective layers may be formed of one of silicon nitride and silicon oxide. Also, the first and second protective layers may be patterned by an anisotropic etching process.

The first recess structure may be formed to a width of 0.5 to 0.8 Mm, and the second recess structure may be formed to a width of 0.1 to 0.15 µm.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EXEMPLARY EMBODIMENTS

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to those skilled in the art. It will also be understood that when a layer is referred to as being "on" another layer or substrate, it can be directly on the other layer or substrate or intervening layers may also be present. In the drawings, the thicknesses of layers and regions are exaggerated for clarity. The same reference numerals are used to denote the same elements throughout the specification.

FIGS. 2A through 2K are cross-sectional views illustrating a method of fabricating a pseudomorphic high electron mobility transistor (PHEMT) according to an exemplary embodiment of the present invention.

Figure 2A:
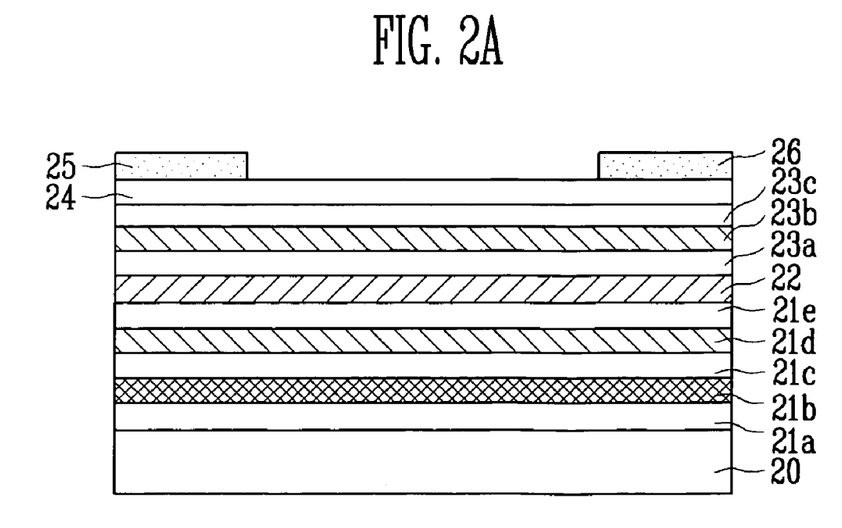
FIGS. 2A through 2K are cross-sectional views illustrating a method of fabricating a pseudomorphic high electron mobility transistor according to an exemplary embodiment of the present invention.

Referring to FIG. 2A, a GaAs layer 21a, an AlGaAs/GaAs superlattice layer 21b, an undoped AlGaAs layer 21c, a Si planar doping layer 21d, and an AlGaAs spacer layer 21e are formed on a semi-insulating substrate 20, and a channel layer 22 is formed on the AlGaAs spacer layer 21e. An AlGaAs spacer layer 23a is formed on the channel layer 22 to prevent transfer of carriers to the substrate 20 and function as a buffer layer for the channel layer 22. A Si surface doping layer 23b and an AlGaAs Schottky layer 23c are formed on the AlGaAs spacer layer 23a. The AlGaAs Schottky layer 23c forms a Schottky junction with a gate. A capping layer 24 is formed on the AlGaAs Schottky layer 23c, and a source electrode 25 and a drain electrode 26 are formed on the capping layer 24.

The semi-insulating substrate 20 may be a GaAs substrate, and the GaAs layer 21a, the AlGaAs/GaAs superlattice layer 21b, the undoped AlGaAs layer 21c, the Si surface doping layer 21d, the AlGaAs spacer layer 21e, the channel layer 22, the AlGaAs spacer layer 23a, the Si surface doping layer 23b, and the AlGaAs Schottky layer 23c may be formed by an epitaxial growth process. The channel layer 22 may be an InGaAs layer, and the capping layer 24 may be an $N^+$-doped GaAs layer. The source electrode 25 and the drain electrode 26 may be formed of an alloy of metals, such as AuGe/Ni/Au, which is obtained by depositing the metals and annealing the metals using a rapid thermal annealing (RTA) process.

Figure 2B:
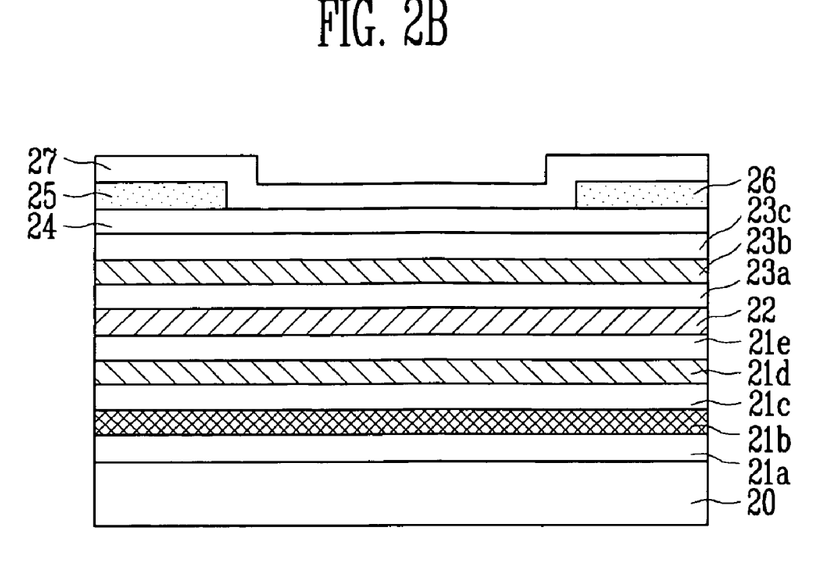

Referring to FIG. 2B, a first protective layer 27 is formed on the entire surface of the resultant structure including the source electrode 25 and the drain electrode 26 to have a thickness of about 200 to 500 Å. The first protective layer 27 may be formed of silicon nitride or silicon oxide using a plasma-enhanced chemical vapor deposition (PECVD) process or a sputtering process.

Figure 2C:
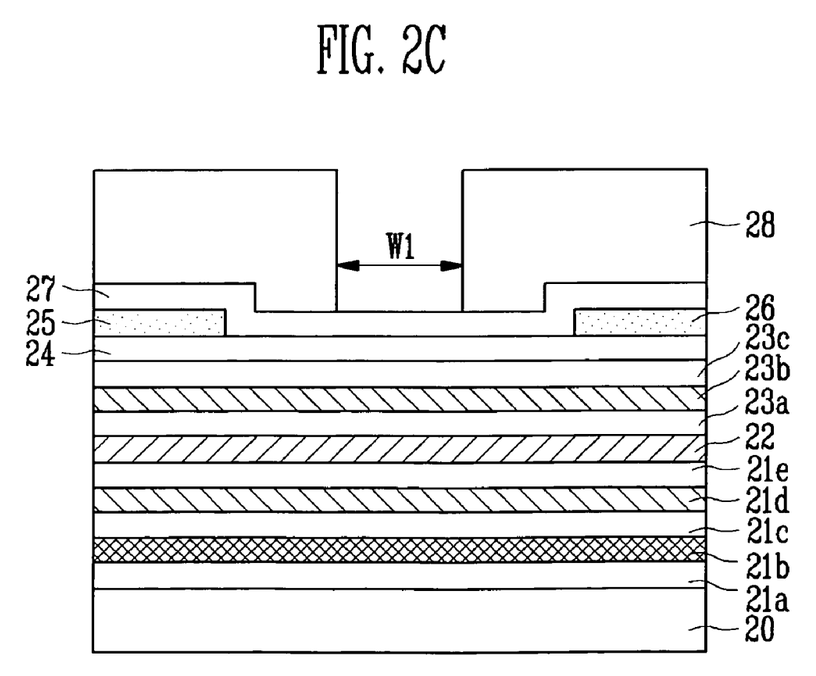

Referring to FIG. 2C, a photoresist layer 28 is formed on the first protective layer 27 and then patterned, thereby exposing a portion of the first protective layer 27 in a channel region between the source electrode 25 and the drain electrode 26. In this case, an opening of the photoresist layer 28 is formed to a width "w1" of 0.5 to 0.8 μm such that a gate electrode (not shown) is not in contact with the capping layer 24. After the photoresist layer 28 is coated on the first protective layer 27, the photoresist layer 28 is baked. Also, the patterning of the photoresist layer 28 is performed through an exposure process and a developing process using a predetermined mask.

Figure 2D:
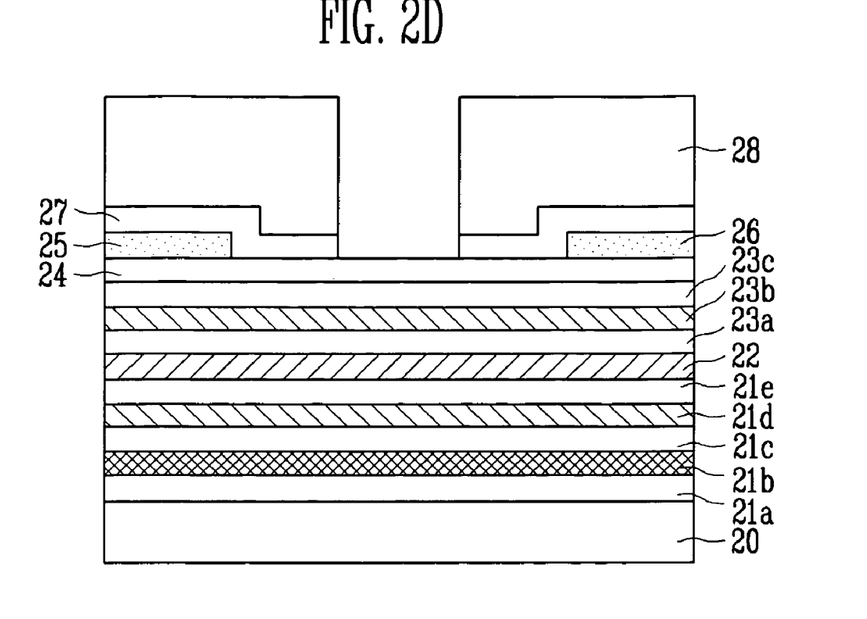

Referring to FIG. 2D, the exposed portion of the first protective layer 27 is removed by a dry etching process using the patterned photoresist layer 28 as a mask. The dry etching process makes use of a reactive ion etching (RIE) process such that the exposed portion of the first protective layer 27 is anisotropically etched. In this case, overetching is performed on the condition that the capping layer 24 is not damaged but the exposed portion of the first protective layer 27 is completely removed.

Figure 2E:
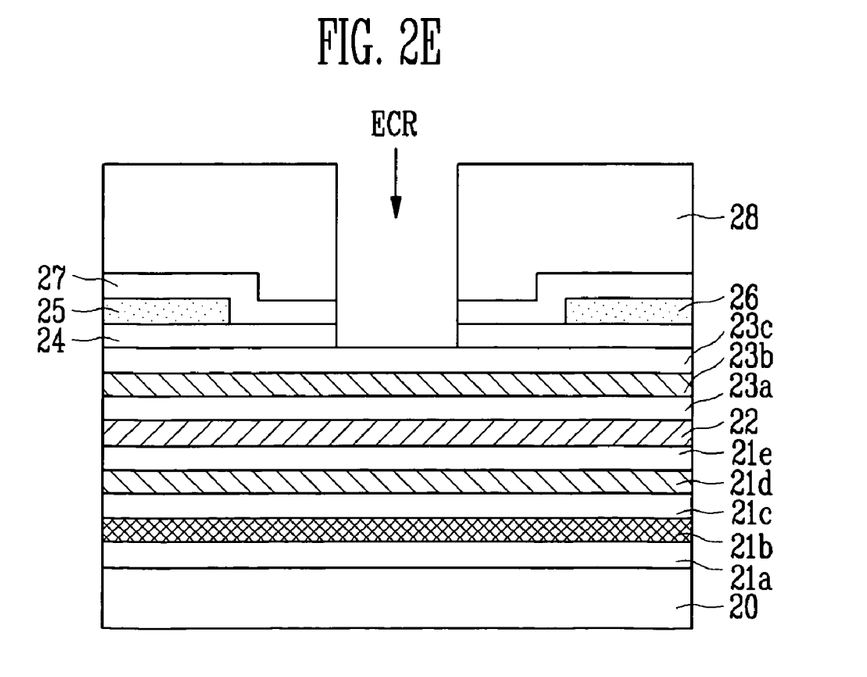

Referring to FIG. 2E, an exposed portion of the capping layer 24 is removed by a dry etching process using the patterned photoresist layer 28 as a mask. The dry etching process makes use of an electron cyclotron resonance (ECR) method. In this case, the ECR method may be performed using $BCl_3$/$SF_6$ gas to etch only the capping layer 24.

Figure 2F:
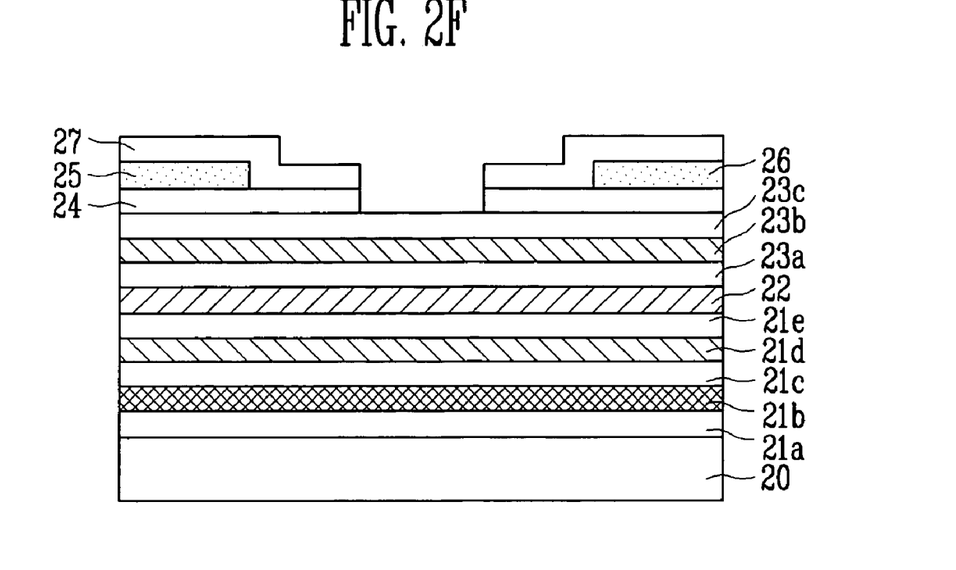

Referring to FIG. 2F, the photoresist layer 28 is removed. Thus, a first recess structure having a width of 0.5 to 0.8 μm is completed. By forming the first recess structure using the first protective layer 27, an interval between the capping layers 24 is held wide so that the PHEMT can have a high breakdown voltage. In addition, since an active region is protected by the first protective layer 27, oxidation of the active region is prevented during a subsequent process.

Figure 2G:
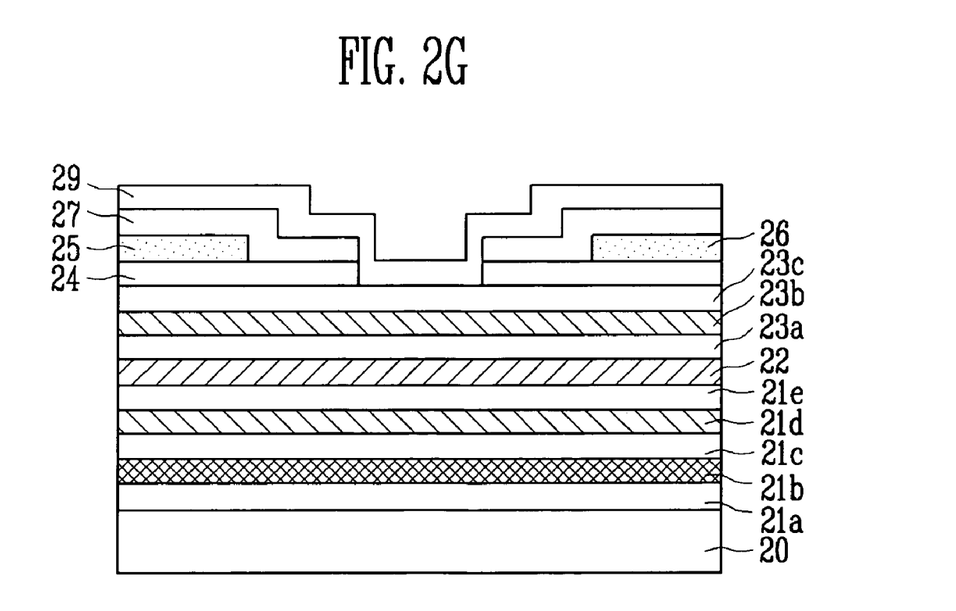

Referring to FIG. 2G, a second protective layer 29 is formed on the entire surface of the resultant structure to have a thickness of about 200 to 500 Å. The second protective layer 29 may be formed of silicon nitride or silicon oxide.

Figure 2H:
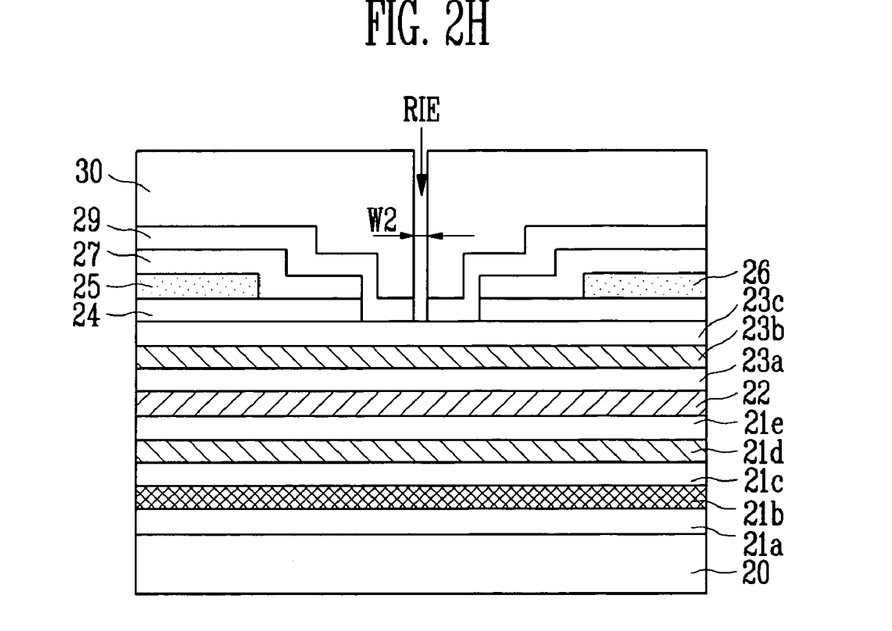

Referring to FIG. 2H, a photoresist layer 30 is formed on the entire surface of the resultant structure to have a thickness of about 2500 Å and then patterned to expose a portion of the second protective layer 29 in the first recess structure. In this case, the photoresist layer 30 is patterned by an exposure (irradiation) and developing process using e-beams such that an opening of the photoresist layer 30 is formed to a fine width "w2" of 0.1 to 0.15 μm, which is less than the width "w1" of the opening of the photoresist layer 28. The photoresist layer 30 may be formed of poly methyl methacrylate (PMMA). Also, after the photoresist layer 30 is coated, the photoresist layer 30 is baked.

Thereafter, the exposed portion of the second protective layer 29 is removed by a dry etching process to expose the Schottky layer 23c. The dry etching process makes use of an RIE process such that the exposed portion of the second protective layer 29 is anisotropically etched. In this case, overetching is performed under the condition that the Schottky layer 23c is not damaged but the exposed portion of the second protective layer 29 is completely removed. Thereafter, the photoresist layer 30 is removed.

As a result, a second recess structure having a width of about 0.1 to 0.15 μm is completed. The second recess structure with a fine linewidth is formed using the second protective layer 29 within the first recess structure so that the length of the gate electrode can be minimized.

Figure 2I:
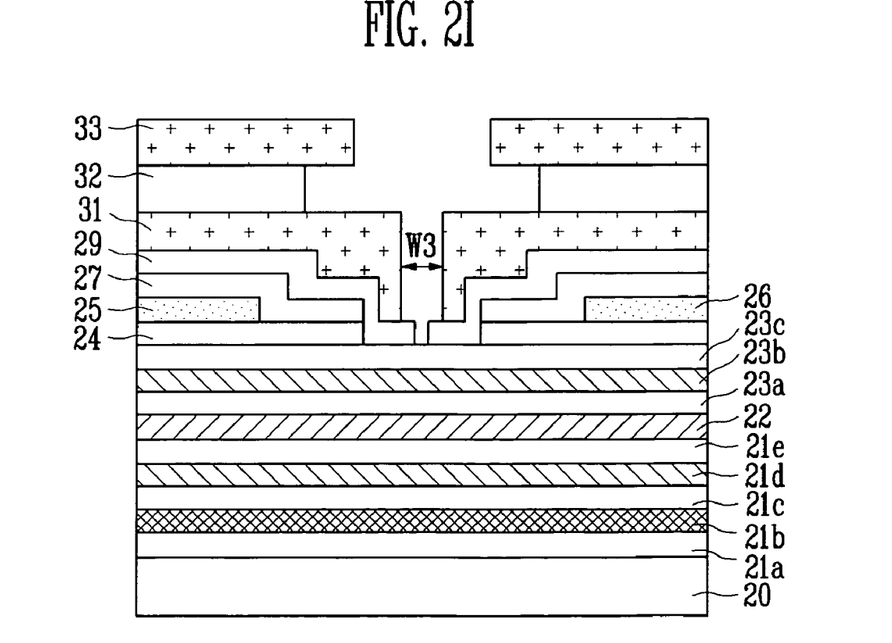

Referring to FIG. 2I, three photoresist layers 31 through 33 are formed on the entire surface of the resultant structure and then patterned using a mask for forming a T-shaped gate. To facilitate the formation of the T-shaped gate, the photoresist layers 31 and 33 are formed of PMMA, and the photoresist layer 32 is formed of co-polymer. The photoresist layers 31 through 33 are coated to a thickness of 2500, 10000, and 1400 Å, respectively, and then baked. Also, the patterning of the photoresist layers 31 through 33 is performed by an exposure (irradiation) and developing processes using e-beams.

As described above, the photoresist layers 33, 32, and 31 are patterned to have a T-shaped opening, so that the photoresist layer 31 defines a leg portion of the gate electrode that is connected to the Schottky layer 23c through the second recess structure, and the photoresist layer 32 defines a head portion of the gate electrode. The photoresist layer 33 is used to facilitate a subsequent metal lift-off process.

Here, an opening of the photoresist layer 31 may be formed to a width "w3" of, for example, 0.3 to 0.4 μm, which is larger than the width "w2" of the second recess structure, so that the sectional area of the gate electrode increases to reduce resistance.

Figure 2J:
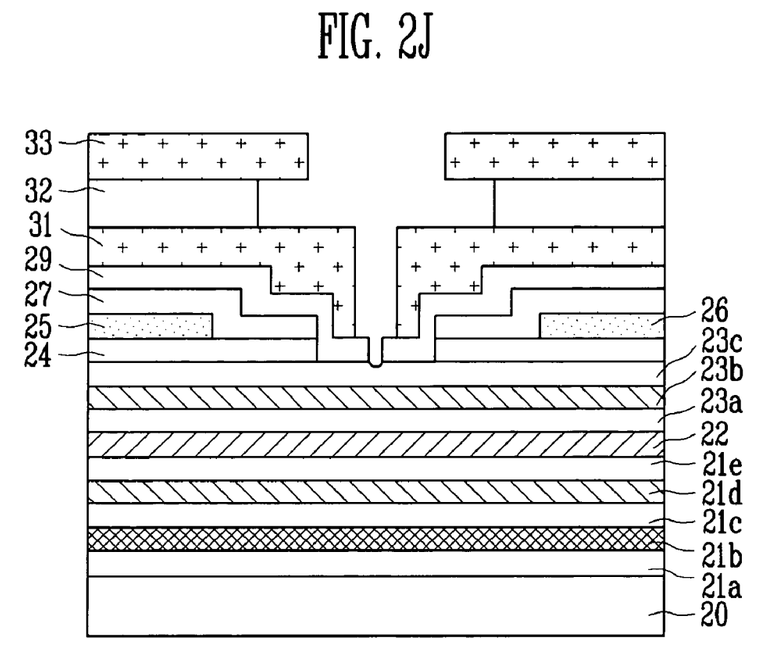

Referring to FIG. 2J, an exposed portion of the Schottky layer 23c is partially etched by a dry etching process using an ECR method. In this case, the dry etching process using the ECR method is performed using $BCl_3/SF_6$ such that only the exposed portion of the Schottky layer 23c is etched. In this etching process, a third recess structure is formed to a fine linewidth of 0.1 to 0.15 μm, which is equal to the width "w2" of the second recess structure, and thus a current flowing between the source electrode 25 and the drain electrode 26 can be controlled as desired.

Figure 2K:
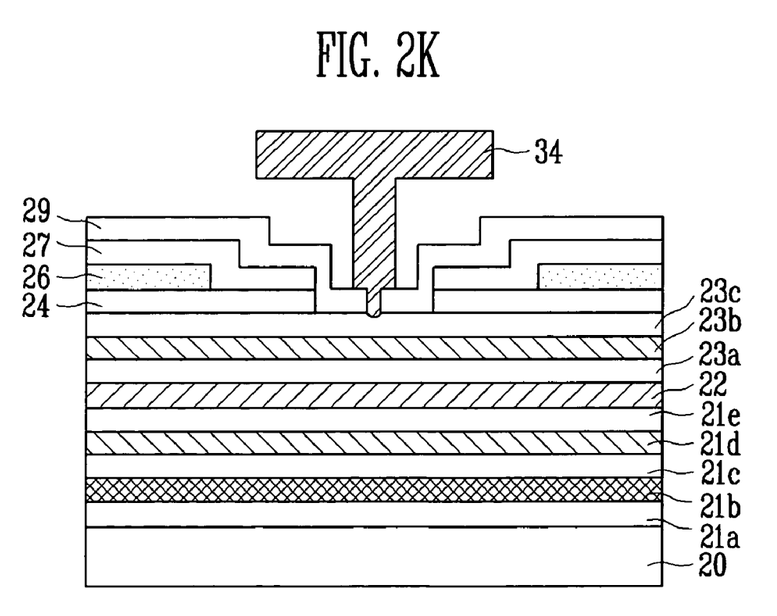

Referring to FIG. 2K, a metal layer is deposited on the entire surface of the resultant structure to a thickness of 6000 to 7000 Å to fill the opening of the patterned photoresist layers 31 to 33. After that, the photoresist layers 33, 32, and 31 and the metal layer deposited on the photoresist layer 33 are removed by a lift-off process, thereby forming a T-shaped gate 34. Here, the metal layer is formed of Ti/Pt/Au using an e-beam vacuum evaporation method.

Figure 3:
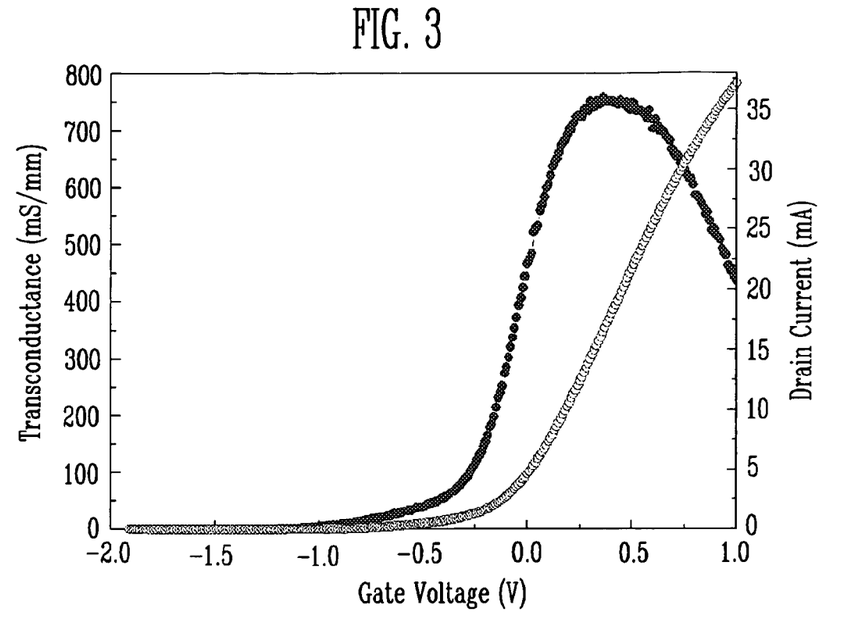
FIGS. 3 through 5 are graphs showing the electrical characteristics of a pseudomorphic high electron mobility transistor fabricated according to the present invention.

FIG. 3 is a graph showing the characteristics of a PHEMT fabricated according to the present invention. Specifically, FIG. 3 is a graph of transconductance Gm and drain current Ids with respect to gate voltage when a voltage of 1.5 V is applied to a drain. From FIG. 3, it can be observed that as the gate voltage increased, the drain current increased. Also, when the gate voltage was 0.4 V, the transconductance Gm reached the maximum value of 765 mS/mm.

Figure 4:
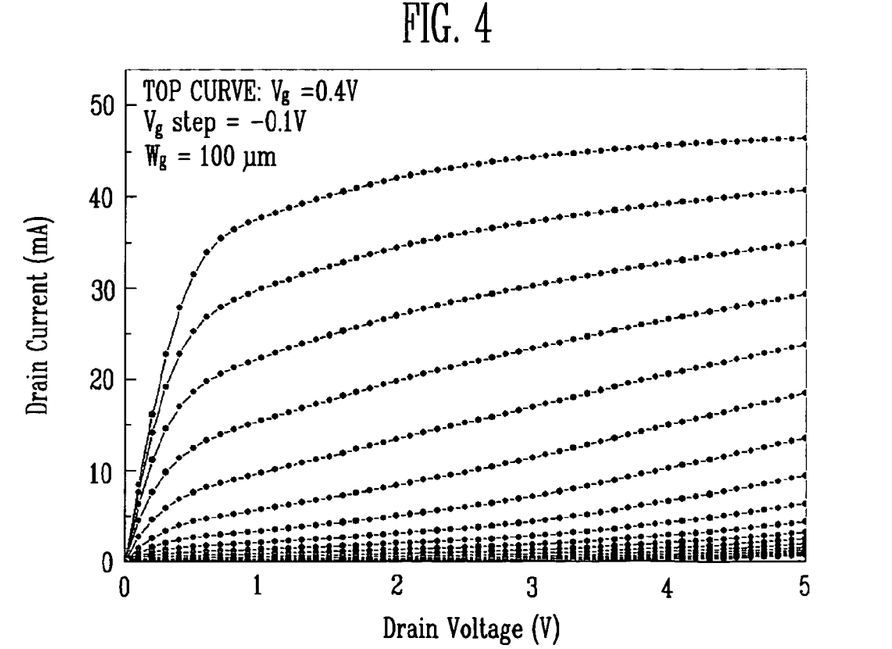

FIG. 4 is a graph showing drain current-voltage characteristics of the PHEMT fabricated according to the present invention. The PHEMT had a knee voltage of 0.5 V and a pinch-off voltage Vp of −0.9 V. When a gate voltage was 0 V and a drain voltage was 5 V, the current density of a drain was about 250 mA/mm.

Figure 5:
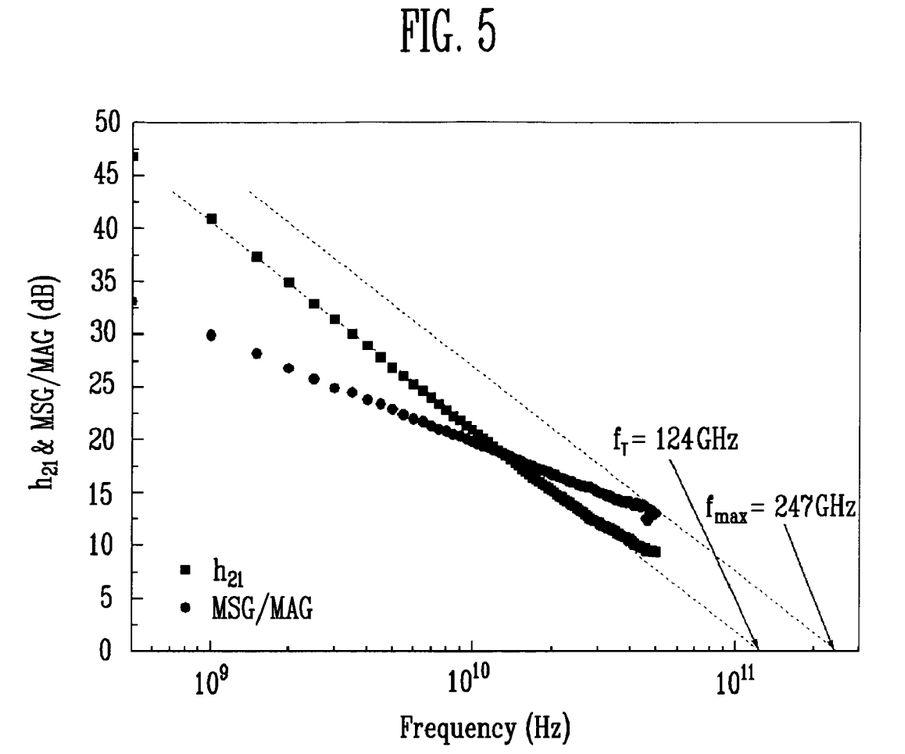

FIG. 5 is a graph showing high-frequency characteristics of the PHEMT fabricated according to the present invention. When a drain voltage was 1.2 V and a gate voltage was 0.4 V, the cut-off frequency $f_T$ and maximum oscillation frequency $f_{max}$ of the PHEMT was 124 GHz and 247 GHz, respectively. It is estimated that these results were derived from a reduction in parasitic capacitance caused by the first and second protective layers 27 and 29 formed between the gate electrode 34 and the source electrode 25/the drain electrode 26. Consequently, it can be seen that the PHEMT according to the present invention has high-frequency and high-speed characteristics and can be applied to high-frequency devices.

According to the present invention as described above, a protective layer is formed and then etched by a dry etching process to complete a double recess structure. Thus, an active region is not exposed due to the protective layer so that the electrical characteristics of a PHEMT do not deteriorate and the breakdown voltage of the PHEMT can increase. Also, since the double recess structure obtained through the dry etching process makes it easier to realize a fine linewidth, the length of a gate electrode can be minimized, and a source resistance, a gate resistance, and a capacitance between gate and source/drain can be effectively reduced. Therefore, the PHEMT according to the present invention can have excellent electrical characteristics and high-frequency and high-speed characteristics so that the PHEMT can be applied to high-frequency devices.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A method of fabricating a pseudomorphic high electron mobility transistor (PHEMT), comprising the steps of:
   preparing a substrate including a channel layer and a capping layer that is the uppermost layer;
   forming a source and a drain on the capping layer;
   forming a first protective layer on the entire surface of the resultant structure and then patterning the first protective layer to expose a portion of the capping layer in a channel region;
   removing the exposed portion of the capping layer to form a first recess structure;
   forming a second protective layer on the entire surface of the resultant structure and then patterning the second protective layer to expose a portion of the substrate in the first recess structure so that a second recess structure is formed;
   forming a multilayered photoresist layer on the entire surface of the resultant structure and then patterning the multilayered photoresist layer to expose a portion of the substrate through the second recess structure and form a gate-shaped opening; and
   depositing a metal layer to fill the gate-shaped opening and then removing the multilayered photoresist layer to form a gate connected to the substrate through the second recess structure.

2. The method according to claim 1, wherein each of the first and second protective layers is formed of silicon nitride or silicon oxide.

3. The method according to claim 1, wherein the first and second protective layers are patterned by an anisotropic etching process.

4. The method according to claim 1, wherein each of the first and second protective layers is formed to a thickness of about 200 to 500 Å.

5. The method according to claim 1, wherein the first recess structure is formed to a width of 0.5 to 0.8 μm, and the second recess structure is formed to a width of 0.1 to 0.15 μm.

6. The method according to claim 1, wherein the multilayered photoresist layer has a structure of MMA/co-polymer/PMMA.

7. The method according to claim 1, wherein the gate-shaped opening has a T shape or a mushroom shape.

8. The method according to claim 1, after patterning the multilayered photoresist layer, further comprising the step of etching a portion of the substrate exposed through the gate-shaped opening by a predetermined thickness.

9. The method according to claim 1, wherein the step of removing the multilayered photoresist layer is performed by a lift-off process.

* * * * *